United States Patent
Hirano (10) Patent No.: US 8,806,318 B2
(45) Date of Patent: Aug. 12, 2014

(54) FAULT POSITION DETERMINING CIRCUIT, STORAGE DEVICE AND INFORMATION PROCESSING APPARATUS

(75) Inventor: Takahito Hirano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 235 days.

(21) Appl. No.: 13/562,707

(22) Filed: Jul. 31, 2012

(65) Prior Publication Data

US 2013/0067282 A1    Mar. 14, 2013

(30) Foreign Application Priority Data

Sep. 14, 2011    (JP) .................. 2011-201194

(51) Int. Cl.
  *G06F 7/02*      (2006.01)
  *G06F 11/07*     (2006.01)
  *G06F 11/10*     (2006.01)
  *G06F 11/16*     (2006.01)
  *G11C 29/00*     (2006.01)

(52) U.S. Cl.
  CPC .......... *G06F 11/073* (2013.01); *G06F 11/0763* (2013.01); *G06F 11/1024* (2013.01); *G06F 11/167* (2013.01); *G11C 29/00* (2013.01); *G06F 11/0751* (2013.01); *G11C 29/789* (2013.01)

USPC .......................................... 714/819

(58) Field of Classification Search
  CPC .............. G06F 11/073; G06F 11/0763; G06F 11/0751; G06F 11/1024; G11C 29/00; G11C 29/789
  USPC ..................... 714/6.1, 746, 719, 819
  See application file for complete search history.

(56) References Cited

U.S. PATENT DOCUMENTS

| | | | |
|---|---|---|---|
| 6,981,188 B2 * | 12/2005 | Galzur et al. | ................. 714/719 |
| 8,700,947 B2 * | 4/2014 | Imai et al. | .................... 714/6.11 |
| 2010/0088550 A1 | 4/2010 | Imai et al. | |

FOREIGN PATENT DOCUMENTS

| JP | 59-207099 | 11/1984 |
|---|---|---|
| JP | 4595029 | 12/2010 |

\* cited by examiner

*Primary Examiner* — Shelly A Chase
(74) *Attorney, Agent, or Firm* — Fujitsu Patent Center (57) ABSTRACT

A fault analyzing circuit has: a comparing circuit to compare fault data stored in a storage area with a fault being caused with data of an alternation register; and a position identifying circuit to identify an error bit position from data of a comparative result of the comparing circuit.

6 Claims, 8 Drawing Sheets

FAULT POSITION DETERMINING CIRCUIT, STORAGE DEVICE AND INFORMATION PROCESSING APPARATUS

CROSS-REFERENCE TO RELATED APPLICATIONS

This application is based upon and claims the benefit of priority of the prior Japanese Patent Application No. JP 2011-201194, filed on Sep. 14, 2011, the entire contents of which are incorporated herein by reference.

FIELD

The present invention relates to a fault position determining circuit, a storage device and an information processing apparatus.

BACKGROUND

With micronization of a semiconductor technology, a storage device mounted on an information processing apparatus, which is, e.g., a storage element included in a cache, is also micronized, with the result that an error becomes easy to occur due to inversion etc of storage information. Further, as for a circuit within the storage device, a margin of an adjustment value of internal operation timing is reduced for aiming at improving an operation frequency. When the margin is reduced, an operation condition of an operation-enabled voltage or temperature etc is restricted, so that there decreases resistance against, e.g., voltage fluctuations as exemplified by the fluctuations in signal voltage and source voltage or temperature fluctuations. Under such circumstances, the errors of different types and of different properties from those conventional types and properties come to occur.

Measures against the error caused in the storage device have hitherto involved conducting error correction based on, e.g., Error Correcting Code (ECC) and error detection based on a parity check, and so on.

On the other hand, such a technology is proposed as to avoid the error occurring in a cache Random Access Memory (RAM) etc by employing a cache line alternation register. If the error occurs in the cache RAM, the cache line containing an error portion is invalidated, and data is registered again in the cache RAM. Then, when having an access to the error portion of the cache RAM, data in the cache line alternation register is used in place of the data in the error portion, thus providing the data with no error.

[Patent Document 1] Japanese Patent Publication No. 4595029

[Patent Document 2] Japanese Patent Application Laid-Open Publication No. 1984-207099

SUMMARY

One aspect of a technology of the disclosure can be exemplified by a fault analyzing circuit connected to a storage unit and an alternation register to retain, when a fault occurs in a storage area to which data is written in the storage unit, the data by way of an alternation area of the storage area. The fault analyzing circuit has: a comparing circuit to compare fault data stored in the storage area having the fault with data of the alternation register; and a position specifying circuit to specify an error bit position from data of a comparative result of the comparing circuit.

The object and advantage of the embodiment will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT(S)

An information processing apparatus according to one embodiment will hereinafter be described with reference to the drawings. A configuration in the following embodiment is an exemplification, and the present information processing apparatus is not limited to the configuration in the embodiment.

Working Example

Figure 1:
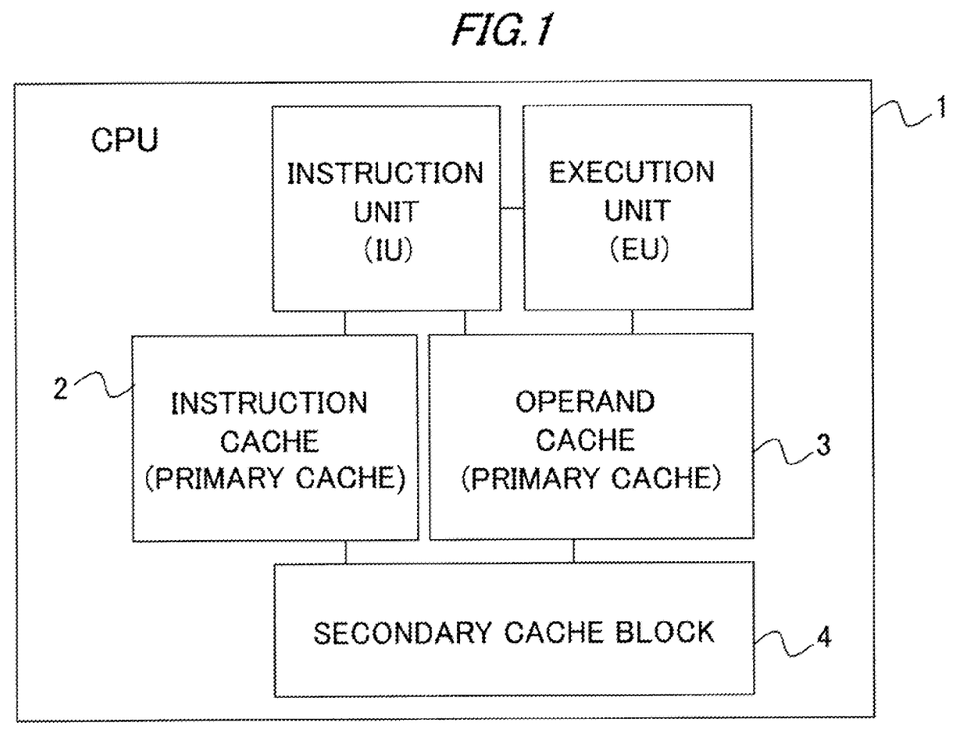
FIG. 1 is a diagram illustrating a configuration of a CPU.

FIG. 1 illustrates a configuration of a Central Processing Unit (CPU) 1 included in the information processing apparatus. Note that the information processing apparatus includes, in addition to the CPU 1, a main storage device, peripheral devices, an external storage device, a network card, etc, which are not illustrated herein. Further, the information processing apparatus may include a display, an input device, etc. The CPU 1 is one example of a processing unit.

As depicted in FIG. 1, the CPU 1 includes, e.g., an Instruction Unit (IU), an Execution Unit (EU), an instruction cache 2 defined as a primary cache, an operand cache 3 as a primary cache and a secondary cache block 4.

The IU acquires an instruction from the instruction cache 2 and supplies the instruction to the EU. The EU executes an arithmetic logical operation corresponding to the instruction supplied from the IU. An arithmetic logical operation will hereinafter be simply referred to as an arithmetic operation. Operation target data called as an operand is specified in the main storage device, in which case the EU acquires the operation target data via the operand cache 3. After completing the arithmetic operation, if a storage location of the operation result is the main storage device, the EU stores the operation result in the main storage device via the operand cache 3.

The instruction cache 2, when reading (which is also termed "fetching") the instruction from the unillustrated main storage device via the secondary cache block 4, hands over the instruction to the IU at a high speed by way of a buffer storage of the main storage device in place of the main storage device. The instruction cache 2 is higher in speed and smaller in capacity than the main storage device.

Similarly, the operand cache 3, when reading the data from the unillustrated main storage device through the secondary cache block 4, hands over the data to the EU at the high speed by way of a buffer storage of the main storage device as a substitute for the main storage device. The operand cache 3 is higher in speed and smaller in capacity than the main storage device.

In an example of FIG. 1, the secondary cache block 4 is provided between the primary caches (the instruction cache 2, the operand cache 3) and the unillustrated main storage device. The secondary cache block 4 provides, similarly to the instruction cache 2 or the operand cache 3, a function as a buffer storage device that is higher in speed and smaller in capacity than the main storage device. The secondary cache block 4 is, however, lower in speed but larger in capacity than the instruction cache 2 or the operand cache 3 in many cases. Note that a tertiary cache block may be provided between the secondary cache block 4 and the main storage device. The instruction cache 2 or the operand cache 3 etc is one example of the storage device. The instruction cache 2 or the operand cache 3 etc will hereinafter be generically termed a cache RAM (Random Access Memory).

The CPU 1 includes a cache line alternation register in order to recover the cache RAM from an error. The cache line alternation register will hereinafter be simply referred to as the alternation register. Namely, the CPU 1 is supposed to be a CPU including a "recovery flow" based on the alternation register. A case that the CPU 1 includes the alternation register, however, embraces a case that the cache RAM includes the alternation register. Further, the alternation register includes an alternation data register which retains the data to be cached, an alternation address register which retains an address of the data to be cached, and an alternation WAY register which indicates WAY of the cache that caches the data to be cached, this data being associated with the data in the alternation data register.

In the information processing apparatus according to the embodiment, if a permanent fault occurs in the primary cache of the CPU 1, the recovery flow against the permanent fault is carried out, and correct data with no error is registered in the alternation register. Herein, the permanent fault connotes a fault that continues for a certain period of time or longer, and therefore excludes a temporarily caused fault such as a soft error (temporary error) in which bits are inverted due to influence of alpha rays etc. The present working example deals with the permanent fault in the faults of the cache RAM. Further, in the working example, a fault that a data error occurs in the storage device is also termed an error.

The CPU 1 further includes a comparing circuit (simply called as comparator) which compares, after the correct data has been registered in the alternation register, the data read from the cache RAM with the data read from the alternation register, and a position identifying circuit which identifies an error bit from a result of the comparison made by the comparing circuit. The data containing the error bit detected by the comparing circuit and the position specifying circuit is retained by a retain circuit etc. Retaining the data in the retain circuit is for enabling the error portion to be analyzed by debugging etc.

A bit position where the permanent fault occurs can be identified by analyzing the retained data. A configuration and an operation of the CPU 1 will hereinafter be described for exemplifying a recovery method for the storage device such as the cache RAM. The description does not, however, imply that the present storage device is limited to the following configuration.

Figure 2:
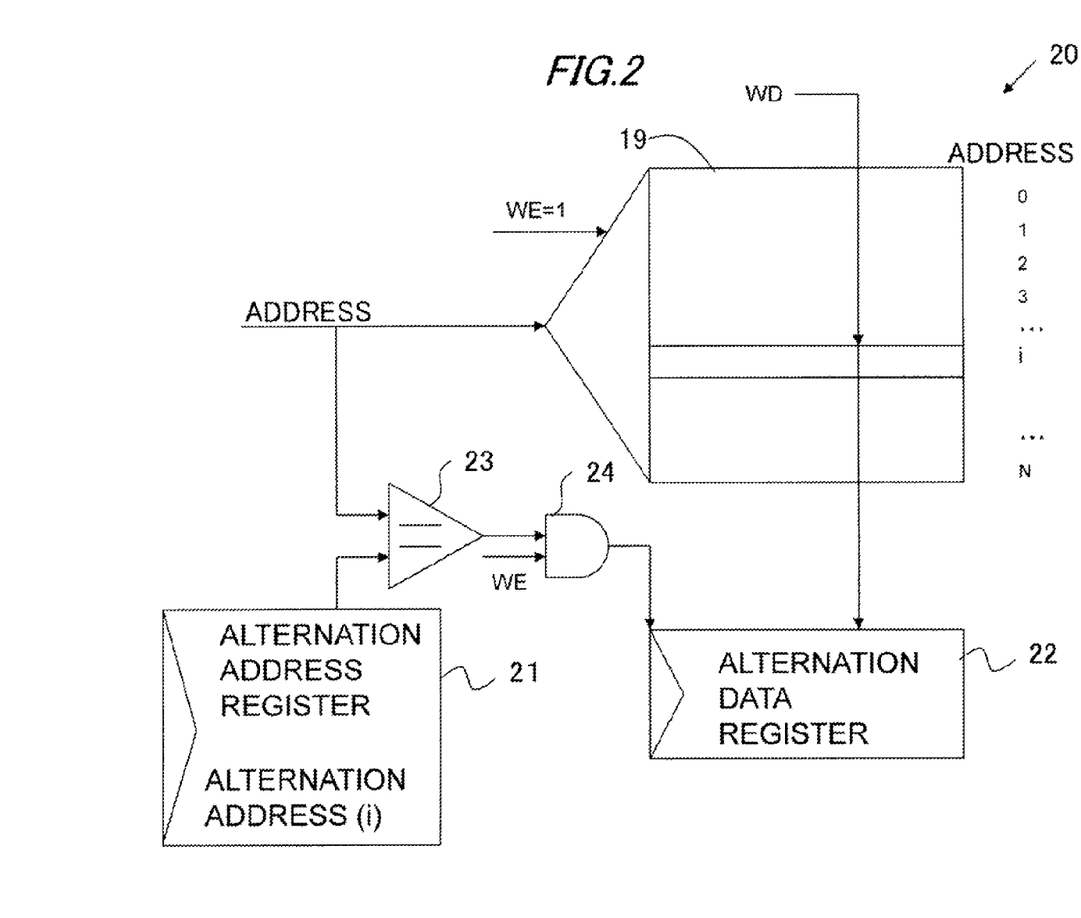
FIG. 2 is a diagram illustrating an updating operation of an alternation register.

FIG. 2 illustrates a cache RAM 20 and an update operation of the alternation data register 22. The cache RAM 20 includes, e.g., a RAM unit 19 and a recovery circuit which provides a recovery function when the fault occurs in the cache RAM 20. The recovery circuit includes, an alternation address register 21, an alternation data register 22, a comparator 23 and an enable signal generating circuit 24. Note that the cache RAM 20 further includes an alternation WAY register, however, FIG. 2 omits its illustration. The cache RAM 20 is one example of the storage device, and the RAM unit 19 is one example of a storage area.

The RAM unit 19 is a memory area having storage element arrays of the cache RAM 20. The working example does not particularly limit a configuration of the RAM unit 19. The RAM unit 19 takes, e.g., 2 WAY configuration. Further, the RAM unit 19 includes eight pieces of RAMs each having, e.g., a word count "512" and an 8-byte data width per word. Accordingly, it follows in this example that a capacity of the RAM unit 19 is given such as 512×8×8=32 KB. Moreover, a cache line count and a byte count per cache line are not particularly limited. One cache line is, however, segmented into a plurality of blocks, and an address for accessing the RAM unit 19 enables the cache line and the block in the cache line to be identified. On the other hand, the alternation data register has a capacity capable of retaining the data corresponding to one block in the cache line. For example, if a cache line size is 128 bytes and a one block size is 32 bytes, it is assumed that the alternation register can retain 32 byte. Further, if the cache line size is 128 bytes and the one block size is 8 bytes, it is assumed that the alternation register can retain 8 byte. Still further, the alternation register functions in the 2 WAYs in common. Namely, the alternation register retains the data of one WAY that gets into a breakdown. Taking into consideration, e.g., a case that the faults simultaneously occur in the plurality of WAYs, however, the alternation registers corresponding to the plurality of WAYs may also be prepared.

When the data retained by the alternation data register 22 as a substitute is stored in the original cache RAM 20 (RAM unit 19), the address of the storage location of the data in the cache RAM 20 will hereinafter be referred to as an alternation address. Further, when the data retained by the alternation data register 22 is stored in the original cache RAM 20, the WAY of the storage location of the data in the cache RAM 20 is referred to as an alternation WAY. In the working example, an initial address of the alternation address is an address "0", and the alternation WAY is set to "0". That is, in an initial status, the alternation data register 22 is set to retain the data given such as "address of cache RAM 20=0" and "WAY=0".

In the cache RAM 20, such a case is assumed that a 1-bit permanent fault occurs in an address other than the alternation address (the initial value "0") and an area of WAY other than the alternation WAY. An assumption in the example of FIG. 2 is that the fault occurs in the cache line containing the word given by an address=i. In this case, an error recovery flow is performed. An outline of the error recovery flow will hereinafter be described. To start with, the cache line containing the location (address=i) of the permanent fault is invalidated. In the invalidated cache line, "invalidation" is set in an unillustrated invalidation flag etc provided for every cache line.

When the error is caused in the cache line, the cache line undergoing the occurrence of the error is invalidated, and the alternation address of the alternation address register 21 and the alternation WAY of the alternation WAY register are updated. For instance, pieces of information indicating the fault cache line with the error being caused and the block with the error being caused in the fault cache line, are registered in the alternation address register 21. In the working example, the information indicating the fault cache line undergoing the occurrence of the error and the block undergoing the occurrence of the error, is the alternation address. Moreover, the WAY with the error being caused is registered in the alternation WAY register.

Upon completing the invalidating process, the access to the permanent fault cache line is started, and the invalidated cache line gets into a cache miss status. The cache line becoming the cache miss status makes a move-in request (refill) for the cache etc of a low order hierarchy. A move-in process is executed in response to the move-in request, and the correct data with no error, which is given from the low order hierarchy, is registered again in the error cache line. A hatching portion containing the address=I in FIG. 2 corresponds to the cache line with the data being re-registered. The re-registration with respect to the cache RAM 20 is conducted, and the same data as the re-registered data is registered in the alternation data register 22, thus completing the move-in process.

For example, in the working example, if the cache line size is 128 bytes and the capacity of the alternation data register 22 is 32 bytes, in the re-registered 128 byte data of the cache line, the block (32 bytes) specified by the alternation address of the alternation address register 21 is registered in the alternation data register 22.

Therefore, the comparator 23 compares the access address to the cache RAM 20 when accessing the cache line with the alternation address, thereby generating a match signal. The match signal and a write enable signal WE are operated by use of an AND gate in the enable signal generating circuit 24, thereby generating an enable signal. Then, with the enable signal, the alternation data register 22 is write-enabled, and the contents of the alternation data register are updated.

Figure 3:
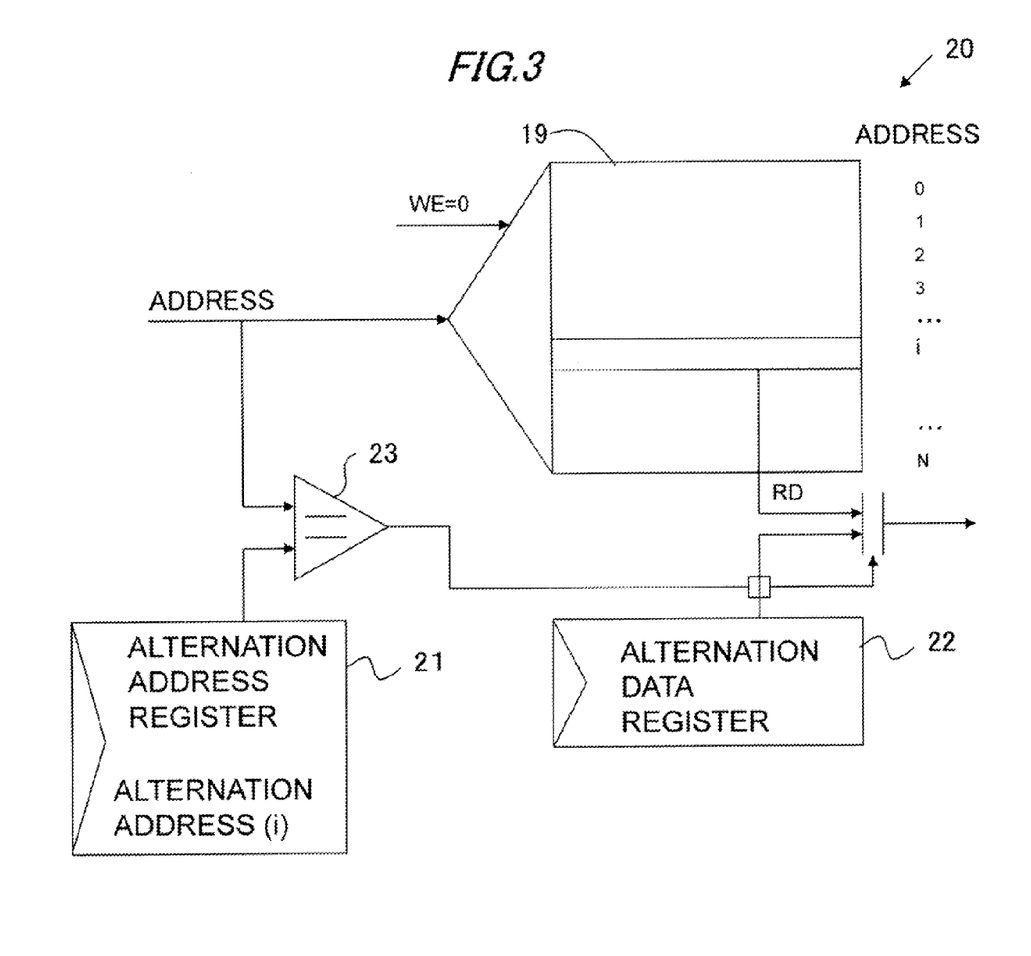
FIG. 3 is a diagram illustrating a reading operation of the alternation register.

FIG. 3 illustrates a reading operation of the alternation data register. When the move-in process is completed, the access request to the cache RAM 20 is accepted, and the read (LOAD) with respect to the permanent fault line is conducted. At this time, the permanent fault exists in the cache RAM 20, and hence the data containing the error is read from the cache RAM 20. The comparator 23 compares the address and the WAY number of the data read from the cache RAM 20 with the alternation address of the alternation address register 21 and with the alternation WAY of the alternation WAY register. FIG. 3, however, omits an illustration of the alternation WAY register.

Then, if the data address read from the cache RAM 20 matches with the alternation address of the alternation address register 21 and if the WAY number of the data read from the cache RAM 20 matches with the alternation WAY of the alternation WAY register, the comparator 23 generates the match signal. FIG. 3, however, illustrates a circuit related to the comparison between the address of the data read from the cache RAM 20 and the alternation address of the alternation address register 21 but omits an illustration of a circuit related to the comparison between the WAY number and the alternation WAY of the alternation WAY register. With the match signal, the data read from the alternation data register 22 is selected, and the correct data with no fault is loaded (LOAD) into the IU (Instruction Unit).

Figure 4:
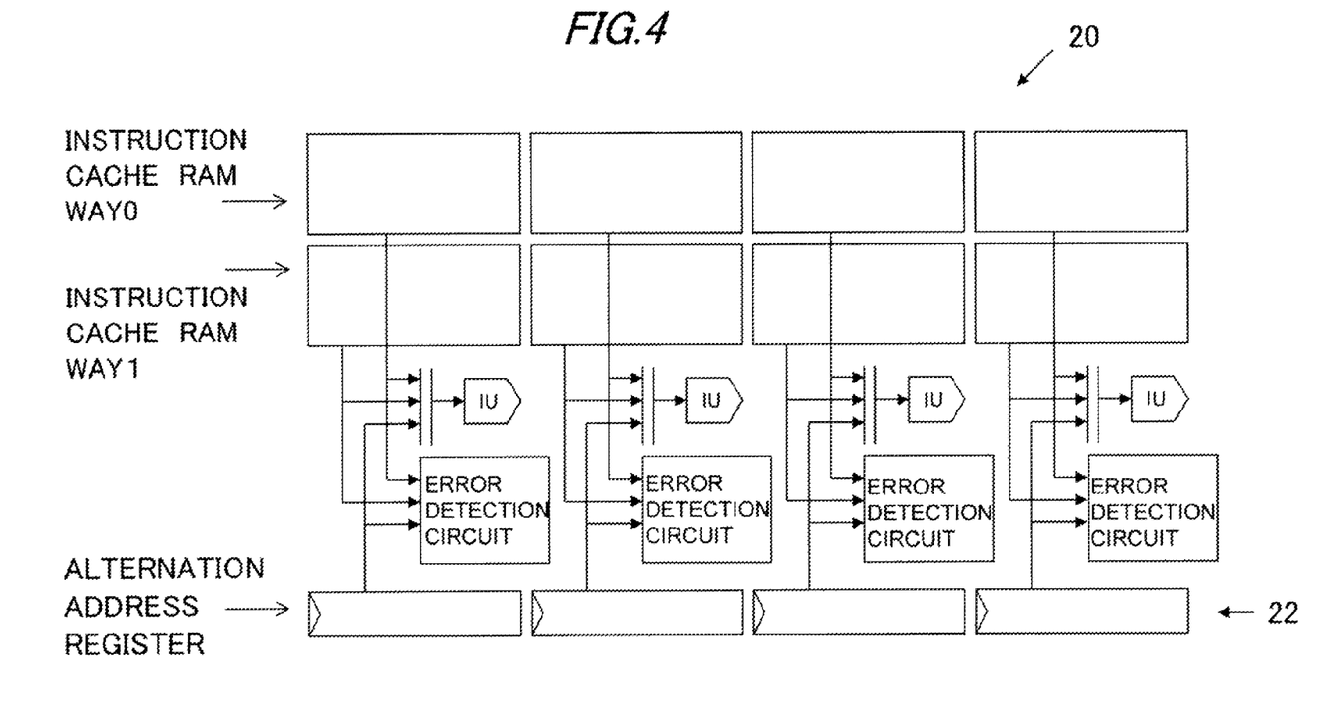
FIG. 4 is a diagram illustrating error detection circuits between cache RAMs and the alternation registers.

FIG. 4 is a diagram illustrating error detection circuits between the cache RAMs 20 and the alternation registers. Four lines of cache RAMs 20 are provided in FIG. 4. In the present storage device, however, this does not imply that the configuration of the cache RAMs 20 is limited to the 4-line configuration, and the cache RAMs 20 may take a single line configuration and may also take a four or more line configuration.

In FIG. 4, the cache RAM 20 of each line includes WAY0 and WAY1. Further, the cache RAM 20 of each line has the alternation data register 22 in common with WAY0 and WAY1. Moreover, in the cache RAM 20 of each line, there is provided the error detection circuit which detects the errors caused in WAY0, WAY1 and the alternation data register 22. The error detection circuit is exemplified such as a parity check circuit, a Cyclic Redundancy Check (CRC) circuit, etc.

When the error detection circuit detects the error of WAY0 or WAY1, the fault cache line in which the error is detected is invalidated. Further, the alternation addresses specifying the fault cache line and the block in the fault cache line are registered in the alternation address register 21 (see FIG. 3).

On the other hand, when reading the data from the cache RAM 20, the data of any one of the cache RAM 20 and the alternation data register 22 is selected depending on whether or not the data (alternation address) of the alternation address register 21 is matched with the address for accessing the cache RAM 20, and is then output to the IU. Note that the instruction cache 2 is assumed as the cache RAM 20 in FIG. 4, and therefore the data is output to the IU. While on the other hand, the operand cache 3 is assumed as the cache RAM 20, in which case the selected data is output to the EU.

Figure 5:
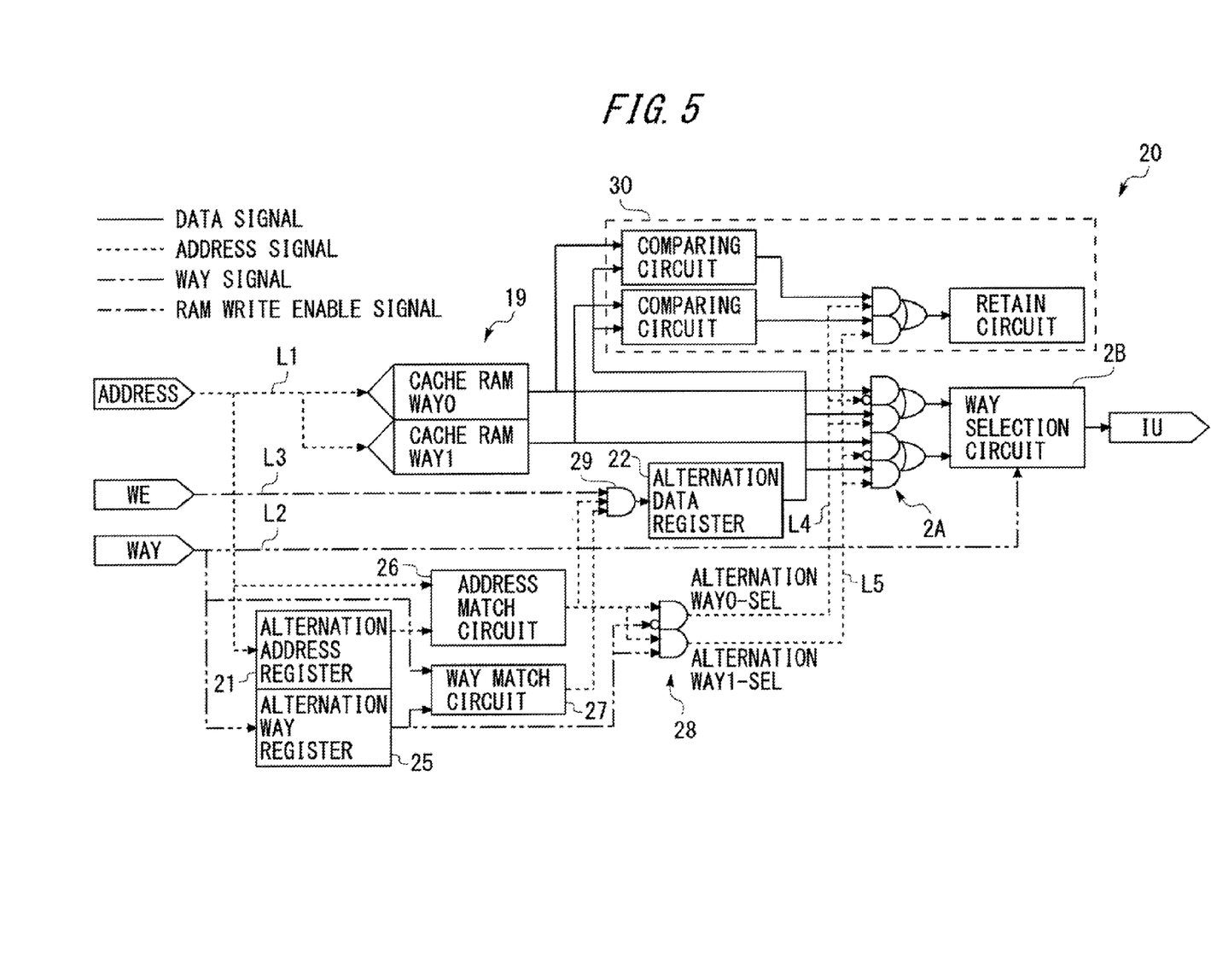
FIG. 5 is a diagram illustrating configurations of the alternation register and a comparing circuit.

FIG. 5 is an diagram illustrating configurations of the alternation register and the comparing circuit within the cache RAM 20 exemplified as the instruction cache 2. FIG. 5 depicts what further concretizes, e.g., one single line of the cache RAM 20 in FIG. 4. In FIG. 5, however, the fault detection circuit is omitted. The operation of the cache RAM 20 will hereinafter be described in a way that takes the configuration in FIG. 5 for example.

As in FIG. 5, the cache RAM 20 includes the RAM unit 19, and the RAM unit 19 includes cache RAM WAY0 and cache RAM WAY1. Furthermore, the cache RAM 20 has, together with the RAM unit 19, three types of registers by way of cache line alternation registers. The first register is the alternation address register 21 (CLAAR: Cache Line Alternation Address Register) which registers and retains addresses indicating where the permanent fault cache line and the block containing the error bit thereof exist on the cache memory. The second register is an alternation WAY register 25 which registers and retains WAY information of the permanent fault cache line. The third register is the alternation data register 22 (CLADR: Cache Line Alternation Data Register) which registers and retains data of one of the blocks in the permanent fault cache line. Herein, the alternation address register 21 retains the address indicating a position of one of the blocks in the permanent fault cache line.

Further, the cache RAM 20 includes two match circuits that accompany the alternation registers. The first match circuit is an address match circuit 26 that compares the address inputted to the cache RAM 20 with a value of the alternation address register 21. The second match circuit is a WAY match circuit 27 that compares WAY specifying information inputted to the cache RAM 20 with a value of the alternation WAY register 25.

Moreover, the cache RAM 20 includes an alternation register selection circuit 2A which selects any one of the data read from the RAM unit 19 and the data given from the alternation data register 22, and a WAY selection circuit 2B which selects any one of WAY0 and WAY1. The data selected by the WAY selection circuit 2B is output to the IU. The configuration does not, however, imply that the cache RAM 20 is limited to the instruction cache 2. Accordingly, for instance, if the cache RAM 20 is the operand cache 3, an output of the WAY selection circuit 2B is output to the EU.

Furthermore, the cache RAM 20 includes a fault position determining circuit 30 that analyzes, when the error occurs in the cache RAM 20, the cache line with the error being caused and a bit position on the cache line. The operation of the cache RAM 20 will hereinafter be exemplified in FIG. 5.

(1) Read from the Cache RAM 20 (a Case of Causing No Error);

When read from the cache RAM 20, an address signal L1 and a WAY selection signal L2 are supplied to the RAM unit 19. Note that when read from the cache RAM 20, a write enable signal L3 is to be negated (set to, e.g., a value "0"). Similarly, when any error is not detected in the RAM unit 19, the unillustrated write enable signal is to be negated so that both of the alternation address register 21 and the alternation WAY register 25 are disabled from accepting the write.

When the RAM unit 19 is supplied with the address signal L1, the data of the block in the cache line corresponding to the address signal L1 are read from WAY0 and WAY1. In the working example, one cache line is provided with, e.g., four blocks, and the address signal L1 specifies the cache line and the block in the cache line.

The address signal L1 is inputted to the alternation address register 21. At this time, the unillustrated write enable signal of the alternation address register 21 is negated, and hence the address signal L1 is not written to the alternation address register 21. Similarly, the WAY selection signal L2 is not written to the alternation WAY register 25.

In the status where no error is detected in the RAM unit 19, the address specified by the address signal L1 is not matched with the value of the alternation address register 21. Accordingly, a result of the comparison of the address match circuit 26 is "false" (e.g., the value "0"), and an AND gate 29 shuts off. Therefore, the value of the alternation data register 22 is not updated.

Further, in FIG. 5, an AND gate 28 has two 2-input AND gates. If the address specified by the address signal L1 is not matched with the value of the alternation address register 21, one input of both of the two 2-input AND gates takes the value "0". Accordingly, both of an alternation WAY0-sel (selection) signal L4 and alternation WAY1-sel (selection) signal L5, which are output signals of the AND gate 28, output the value "0". Then, the alternation register selection circuit 2A selects not the signal from the alternation data register 22 but the data of WAY0 and WAY1 of the RAM unit 19. The selected data of WAY0 and WAY1 of the RAM unit 19 is inputted to a WAY selection circuit 2B. Then, the WAY selection signal L2 is output to the WAY selection circuit 2B, and the data read from WAY0 or WAY1 is output to the IU corresponding to the WAY selection signal L2.

(2) A Case in which the Error is Detected in the Cache RAM 20;

Such a case is presumed that the error is detected in any one of the addresses of the cache RAMs 20. When the error is detected in the cache RAM, the address specifying one block in the cache line with the error occurring in the RAM unit 19 is stored in the alternation address register 21 according to the procedures illustrated in FIG. 2. Similarly, the information indicating WAY with the error being caused is stored in the alternation WAY register 25. At this time, the cache line including the block specified by the address with the occurrence of the error is invalidated.

(3) The Read from the Cache RAM 20 (a Case of Causing the Error);

If the read from the address with the error being detected in the RAM unit 19 occurs, the information of the alternation data register 22 is updated according to the procedures depicted in FIG. 3. To be specific, the invalidated cache line is mishit, then the data is read from the low-order hierarchy, i.e., the cache device such as the secondary cache block 4 in FIG. 1 or a storage device of a low-order layer, and the data of the low-order layer is registered in the cache line of the RAM unit 19, which is specified by the address signal L1 and the WAY selection signal L2.

At this time, in the process (2), the address specifying the block in the cache line with the occurrence of the error is set in the alternation address register 21. Therefore, the address match circuit 26 outputs "true" (e.g., the value "1"). Similarly, the information (WAY number) specifying WAY with the error being caused is set in the alternation WAY register 25. Accordingly, the WAY match circuit 27 outputs "true" (e.g., the value "1"). Further, the write enable signal L3 is asserted (e.g., an output of the value "1"). As a result, the output signal of the AND gate 29 becomes "true" (the value "1"), whereby the alternation data register 22 is write-enabled. As a consequence, the same data as the data registered in the block with the error being detected in the cache line, is registered in the alternation data register 22 from the low-order layer.

Moreover, if the address match circuit 26 outputs "true" (e.g., the value "1"), one input of both of the two 2-input AND gates of the AND gate 28 takes the value "1". Accordingly, any one of the alternation WAY0-sel (selection) signal L4 and the alternation WAY1-sel (selection) signal L5 of the AND gate 28 is asserted based on the value of the alternation WAY register 25. For instance, if the alternation WAY0-sel (selection) signal L4 is asserted, in the alternation register selection circuit 2A, the data from WAY0 of the RAM unit 19 is cut off, and the data of the alternation data register 22 is selected. At this time, the alternation WAY1-sel (selection) signal L5 is negated, and hence, in the alternation register selection circuit 2A, the data from WAY1 of the RAM unit 19 is selected, thereby cutting off the data from the alternation data register 22. Note that if the alternation WAY1-sel (selection) signal L5 is asserted, the selection of the alternation register selection circuit 2A is reversed to the case of asserting the alternation WAY0-sel (selection) signal L4 in each of WAY0 and WAY1.

Then, the WAY selection signal L2 is inputted to the WAY selection circuit 2B, and the data of relevant WAY is output to the IU. Hereafter, when there occurs the read from the block of the cache line with the error being detected, the value of the alternation data register 22 is output in the same procedures as those described above.

Further, if the fault is detected in the cache RAM 20, the fault position determining circuit 30 compares the data of WAY of the address with the fault being detected with the data of the alternation data register 22 by use of the comparing circuit. As a result, a fault bit is indicated by a bit position where the block of the cache line specified by the address signal L1 and the WAY selection signal L2 is not matched with the data of the alternation data register 22. Such being the case, the cache RAM 20 retains the bit position specified by the comparing circuit in the retain circuit.

Namely, if the value of the alternation address register 21 is matched with the value of the access address of the RAM unit 19, a comparative result of a portion corresponding to a read data width is obtained by comparing the data of the alternation data register 22 with the data read from the cache RAM 20. When the retain circuit retains the comparative result as it is, a resource corresponding to the data width is employed. This being the case, the working example involves preparing a circuit which selects the data of the comparative result to enable 1 byte containing the permanent fault bit to be retained in order to reduce the resource to be used.

Figure 6:
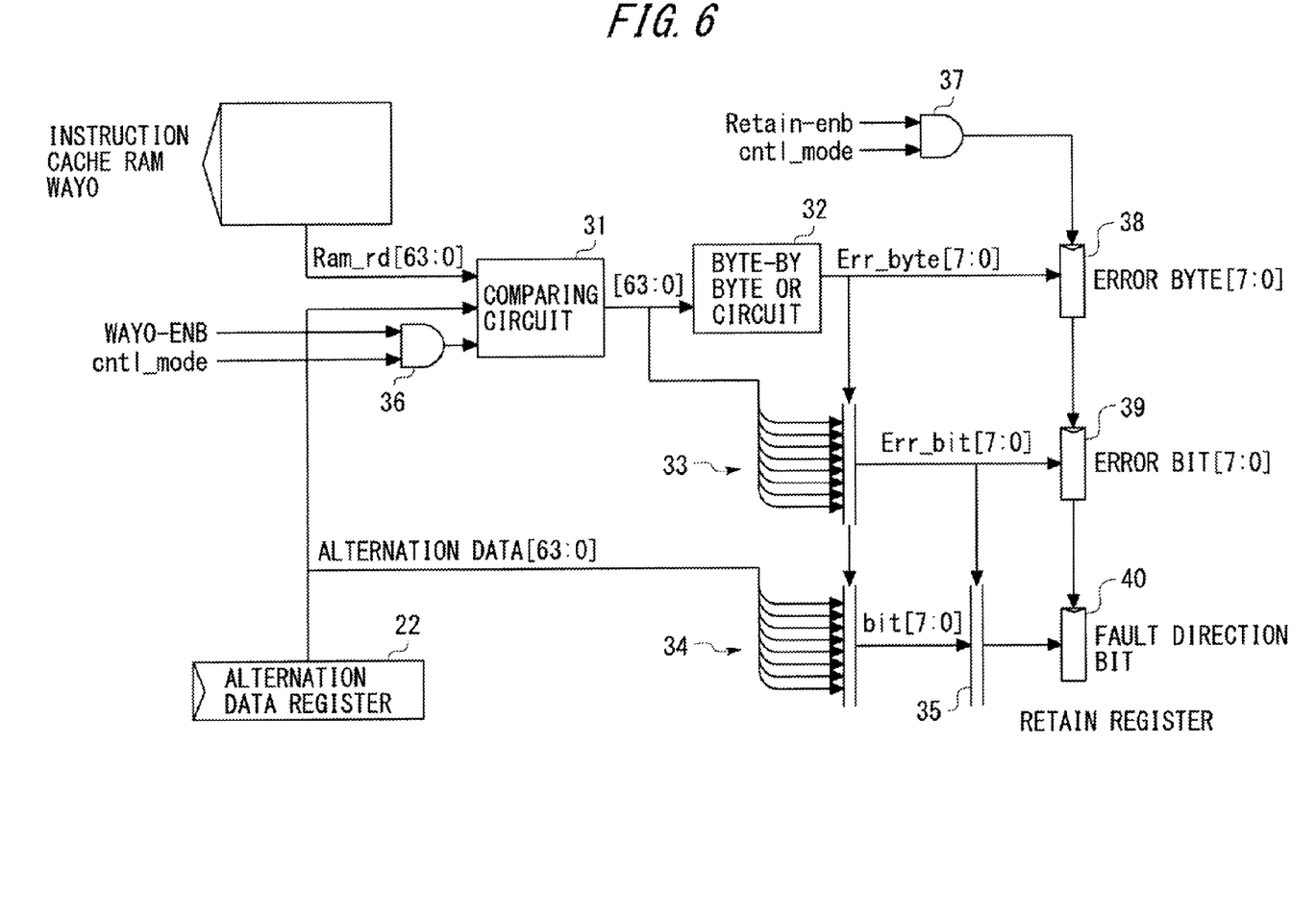
FIG. 6 is a diagram illustrating a fault position determining circuit.

FIG. 6 is a diagram illustrating a configuration of the fault position determining circuit 30. The fault position determining circuit 30 includes a comparing circuit 31. The comparing circuit 31 compares the data of the block in the cache line specified by the address with the occurrence of the error and the WAY number with the data of the alternation data register 22. It is noted, FIG. 6 illustrates the circuit which processes 8 bytes (64 bits) for simplifying the description. That is, the following description of FIG. 6 is made based on the assumption that a size of one block of the cache line is 8 bytes, and the data width of the alternation data register 22 is also 8 bytes. This assumption does not, however, imply that there are limitations on the data width of the block in the cache line and on the data width of the alternation data register 22 in the cache RAM 20.

The comparing circuit 31 is a circuit that executes, e.g., Exclusive OR between the data of one block in the cache line and the data of the alternation data register 22. The comparing circuit 31, when an enable signal (WAY0-ENB) and a control mode signal (cntl_mode) are "true" (e.g., the value "1"), receives an input of the enable signal from an AND gate 36 and is enabled to operate.

The comparing circuit 31 inputs a 64-bit comparative result pattern as an output signal to a byte-by-byte OR circuit 32 and a selector 33. The selector 33 is a multi-selector and selects 1-byte data from eight sets of 1-byte data. The byte-by-byte OR circuit 32 segments the 64-bit comparative result pattern on a byte-by-byte basis (8 bits), and executes an 8-bit OR operation per byte. The data per byte is one example of segmental data.

Then, a logical sum (OR) of the bytes containing the bit value "1" in the 64-bit comparative result pattern becomes "1". On the other hand, the logical sum (OR) of the bytes of all bits "0" in the 64-bit comparative result pattern becomes "0". A bit pattern Err_byte[7:0] of 8 bits is thereby obtained. The byte-by-byte OR circuit 32 and the selector 33 are given by way of one example of the position identifying circuit. Further, the byte-by-byte OR circuit 32 is one example of the OR circuit. Still further, the selector 33 is one example of the selection circuit.

The obtained bit pattern Err_byte[7:0] of 8 bits is set to the selection signal of the selector 33, thereby acquiring Err_bit [7:0] (which is called an error byte) as the byte data containing the bit value "1" (error bit) in the 64-bit comparative result pattern that is output by the comparing circuit 31. A retain register 39 retains Err_bit[7:0]. The error byte Err_bit[7:0] is one example of fault segmental data.

Further, a position of the bit value "1" in the bit pattern Err_byte[7:0] of 8 bits indicates an error byte position in the 64-bit comparative result pattern. A retain register 38 retains the bit pattern Err_byte[7:0] of 8 bits indicating the error byte position.

Similarly, alternation data [63:0] of the alternation data register 22 is inputted to the selector 34. The selector 34 is also the multi-selector and selects the 1-byte data from the eight sets of 1-byte data. The bit pattern Err_byte[7:0] of 8 bits is set also as the selection signal of the selector 34. As a result, there is selected the byte data "bit[7:0]" in the alternation data [63:0] of the alternation data register 22, which corresponds to the error byte position. The selected byte data "bit[7:0]" can be said to be the correct data against the error byte. The byte data "bit[7:0]" is one example of the alternation segmental data. Moreover, the selector 34 is one example of the circuit to select the alternation segmental data on the basis of the OR data.

Accordingly, the byte data "bit[7:0]" as the correct data is inputted to the selector 35, and the error byte Err_byte[7:0] is set as the selection signal, whereby the correct bit value corresponding to the error bit in the correct data can be obtained. The correct bit value is retained as a fault direction bit in the retain register 40. The correct bit value is one example of the alternation bit. Furthermore, the selector 35 is one example of the circuit to select the alternation bit on the basis of the fault segmental data.

Figure 7:
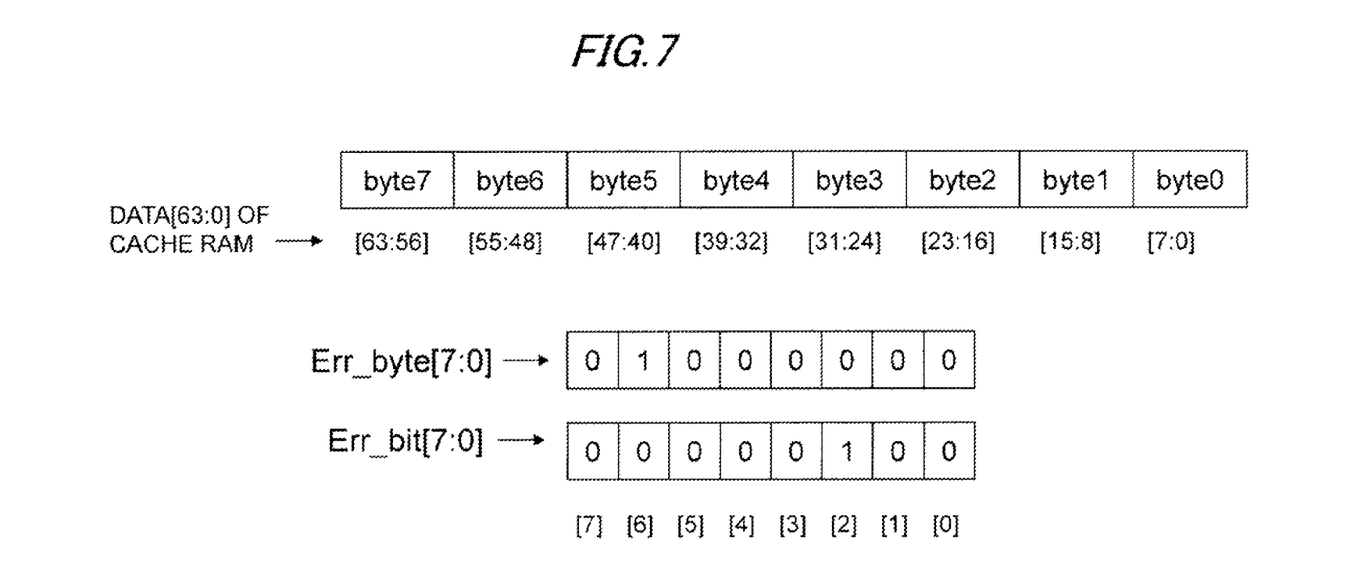
FIG. 7 is a diagram of an analysis example of data retained for determining the fault (error) bit.

FIG. 7 depicts an analysis example of the data retained for determining the fault bit. As in FIG. 7, Err-byte[6]=1 and Err-bit[2]=1, and it is therefore understood that bit[50] among the 64-bit data "bit[63:0]" including data from data Byte0 to Byte7 given from the cache RAM 20 is the error. Note that further if the value of the retain register 40 is "1", the correct data is "1", and hence it is recognized that the error is the fault fixed to the bit "0" or the fault of inverting the bit "1" to "0". Whereas if the value of the retain register 40 is "0", the correct data is "0", and it is therefore recognized that the error is the fault fixed to the bit "1" or the fault of inverting the bit "0" to "1". Namely, the error direction can be identified by the value of the retain register 40.

Note that in FIG. 6, for generating the enable signal of the comparing circuit 31, the enable signal "WAY0-ENB" of WAY0 and the mode signal "cntl_mode" are inputted to the AND gate 36. Then, when both of the enable signal "WAY0-ENB" of WAY0 and the mode signal "cntl_mode" are asserted, the comparing circuit 31 becomes the enable status. Accordingly, if the mode signal "cntl_mode" is negated, the comparing circuit 31 does not operate. Similarly, for generating the enable signals of the retain registers 38-40, an enable signal "Retain-enb" of the retain register and the mode signal "cntl_mode" are inputted to the AND gate 37, thereby generating the enable signals of the retain registers 38-40. Accordingly, if the mode signal "cntl_mode" is negated, the retain registers 38-40 do not operate. Note that the signal "Retain-enb" is a single for controlling the validation and invalidation of the retain register. Thus, the mode signal "cntl_mode" for the bit check of the permanent fault is prepared for the comparing circuit 31 and the retain registers 38-40, thereby validating the operation of the circuit when evaluating a shipping quality and when debugging and also enabling the operation of the circuit to stop, e.g., after being shipped. Owing to the mode signal "cntl_mode" such as this, for instance, it is easily feasible to take a measure for saving the power by restraining an unnecessary operation of the fault position determining circuit 30 after being shipped. The mode signal "cntl_mode" can be also said to be a mode signal for saving the power.

Figure 8:
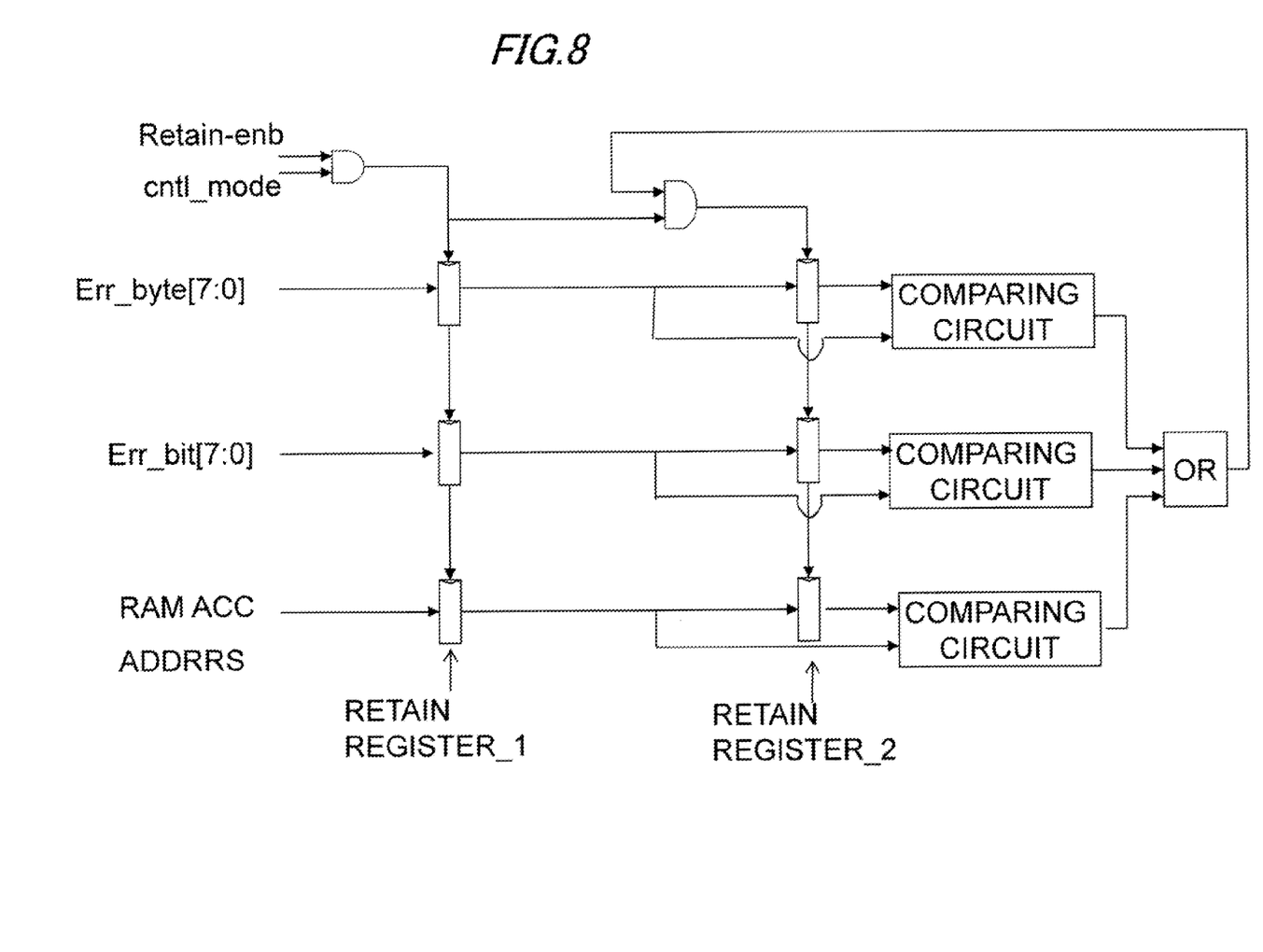
FIG. 8 is a diagram of an example of a circuit which retains a history of a permanent fault bit determination result.

FIG. 8 illustrates an example of a circuit which retains a history of a permanent fault bit determination result. In FIGS. 6 and 7, the error analysis result is retained by the retain register 38 which retains Err-byte[7:0], the retain register 39 which retains Err-bit[7:0] and the retain register 40 which retains the fault direction bit. Therefore, the CPU 1 retains the error analysis result with the small bit count as compared with the bit count (e.g., 64 bits) of the alternation data register 22. Thus, the CPU 1 in the working example can reduce the circuit scale and can therefore record the information dating back to several generations. A circuit to retain the information of several generations will hereinafter be described.

As in FIG. 8, in the CPU 1 in the working example, a retain register_1 and a retain register_2 are prepared. It is to be noted that the signal Retain-enb is a signal for controlling the validation and the invalidation about the read from the cache RAM 20. Further, the signal "cntl_mode" is a signal for, in the same way as in FIG. 7, validating the operation of the circuit when evaluating the shipping quality and when debugging and for stopping the operation of the circuit, e.g., after being shipped. As explained in FIG. 7, when the error occurs in the cache RAM 20, the data is read from the area of the cache RAM 20, which corresponds to the alternation address of the alternation address register 21. Then, the error is analyzed in the process of the fault position determining circuit 30 illustrated in FIG. 6, and the information on the analysis result is registered in the retain register_1. Next, if the error occurs once again in the cache RAM 20, a new error is analyzed in the similar procedures, and the data of the analysis result is acquired. The data of the new analysis result is registered in the retain register_1. At this time, however, the data registered beforehand in the retain register_1 is compared with the data registered in the retain register_2. Then, as a result of the comparison, if there are unmatched items of information (the address, the error byte position, the error bit position), before the data of the new analysis result is acquired, the data registered previously in the retain register_1 is registered in the retain address. It is possible to retain the error information dating back to several generations by adding the circuit such as this, whereby debug efficiency can be increased.

Effects of Working Example

As discussed above, the CPU 1 in the first working example compares, when the error is caused in the cache RAM 20, the data of the block of the cache line in which error occurs with the value of the alternation data register 22 by use of the comparing circuit 31. Then, the CPU 1 can identify the permanent fault bit position from the data of the comparative result. In particular, the CPU 1 in the working example acquires the byte of the correct data of the alternation data register 22, which corresponds to the error byte position. Furthermore, the CPU 1 in the working example acquires the correct bit in the byte of the correct data on the basis of the permanent fault bit position. Therefore, according to the first working example, the bit position with the single bit fault being caused can be determined. Accordingly, the redundant function of the RAMs enables the single bit recovery to be easily attained. The redundant function assumed herein is, e.g., a function of the redundancy to provide 1-bit redundancy bit cells to the blocks in the cache line. As in the working example discussed above, when the fault byte position and the fault bit position can be identified, the access to the address of the block containing the fault bit is made, and, in the case of accessing the bit line including the fault bit position, the redundancy bit cell may be used in place of the fault bit.

Further, in the processes of the working example, the comparative result of the comparing circuit 31 is segmented into the byte data on the byte-by-byte basis, the 8 bits in the byte are inputted to the OR gate, and the OR process is executed per byte. As a result, the byte position with the occurrence of the error can be specified by the 1-bit information per byte. For instance, in the comparative result of the 8 bytes (64 bits), the error byte position can be specified from Err-byte[7:0] of 8 bits.

Moreover, the comparative result data given by the comparing circuit 31 is inputted to the selector 33, and the byte data is selected based on Err-byte[7:0], whereby the byte data Err-bit[7:0] with the error bit being indicated by the value "1" can be selected. The byte data Err-bit[7:0] is the data in which the error bit in the error byte is indicated by "1". Similarly, the data of the alternation data register 22 is inputted to the selector 34, and the byte data is selected based on Err-byte[7:0], thereby enabling the correct byte data "bit[7:0]" corresponding to the error byte to be acquired. Then, the correct byte data "bit[7:0]" corresponding to the error byte is inputted to the selector 35, and the correct bit data corresponding to the error bit is selected based on the byte data "Err-bit[7:0]" containing the error bit, whereby the correct value of the bit with the error being caused can be identified.

As described above, it is feasible to identify the block with the occurrence of the error in the cache line in which the error is caused, the position Err-byte[7:0] of the error byte in the block with the error being caused, the value Err-bit[7:0] in which the error bit in the error byte is indicated by "1", the correct byte data "bit[7:0]" corresponding to the error byte and the correct bit data corresponding to the error bit. Accordingly, the CPU 1 in the working example can retain the error analysis result with the smaller data quantity than in the case of retaining all of the bits of the data of the comparative result of the comparing circuit 31. For example, in the example of FIG. 6, it is possible to identify by 16 bits in total the error byte position from the 8 bits of Err-byte[7:0] in which the error byte position is indicated by the bit "1" and the error bit position from the 8 bits of the value Err-bit[7:0] in which the error bit position in the error byte is indicated by the bit "1", relative to the 64 bits of the comparative result data. Moreover, as a result of the analysis, the data fault direction can be specified, and the verification efficiency of the cache RAM 20 can be increased.

Further, the permanent fault bit determination can be made with the small circuit scale by selecting and retaining the comparative data. Still further, the small circuit scale suffices, and therefore the error information dating back to several generations can be recorded. For example, as depicted in FIG. 8, if the items of error information (the alternation address, the error byte position, the error bit position) are different, these items of error information may be recorded. Then, owing to the error information of several generations, it is feasible to increase the implementation efficiency and the analysis efficiency of the fault detecting function.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A fault position determining circuit connected to a storage unit and an alternation register to retain, when a fault occurs in a storage area in the storage unit to which data is written, the data by way of an alternation area of the storage area, the circuit comprising:
 a comparing circuit to compare fault data stored in the storage area having the fault with the data retained in the alternation register; and
 a position identifying circuit to identify a fault bit position of the fault data on the basis of a comparative result of the comparing circuit.

2. The fault position determining circuit according to claim 1, wherein the comparing circuit is a circuit to obtain exclusive OR data between the fault data and the data retained in the alternation register, and
 the position identifying circuit includes: an OR circuit to segment the exclusive OR data output from the comparing circuit into pieces of segmental data having a predetermined length and to acquire OR data of each bit of the segmental data per each of the pieces of segmental data; and a selection circuit to select fault segmental data containing a fault bit from within the pieces of segmental data into which the exclusive OR data is segmented on the basis of the OR data.

3. The fault position determining circuit according to claim 2, wherein the position identifying circuit further includes a circuit to select alternation segmental data corresponding to the fault segmental data on the basis of the OR data from within pieces of alternation segmental data into which the data retained in the alternation register is segmented.

4. The fault position determining circuit according to claim 3, wherein the position specifying circuit further includes a circuit to select an alternation bit in the alternation segmental data, which corresponds to the fault bit in the fault segmental data, on the basis of the fault segmental data.

5. A storage device comprising:

a storage unit;

an alternation register to retain, when a fault occurs in a storage area to which data is written in the storage unit, the data by way of an alternation area of the storage area;

a comparing circuit to compare fault data stored in the storage area having the fault with the data retained in the alternation register; and a position identifying circuit to identify an error bit position from data of a comparative result of the comparing circuit.

6. An information processing apparatus comprising:

a storage device; and a processing unit to process data stored in the storage device, the storage device including:

a storage unit;

an alternation register to retain, when a fault occurs in a storage area to which data is written in the storage unit, the data by way of an alternation area of the storage area;

a comparing circuit to compare fault data stored in the storage area having the fault with the data retained in the alternation register; and a position identifying circuit to identify an error bit position from data of a comparative result of the comparing circuit.

* * * * *